US010781993B2

(12) United States Patent
Kosugi

(10) Patent No.: US 10,781,993 B2
(45) Date of Patent: Sep. 22, 2020

(54) VEHICLE LUMINAIRE AND VEHICLE LAMP DEVICE

(71) Applicant: Toshiba Lighting & Technology Corporation, Yokosuka-shi, Kanagawa-ken (JP)

(72) Inventor: Daisuke Kosugi, Yokosuka (JP)

(73) Assignee: Toshiba Lighting & Technology Corporation, Yokosuka-shi, Kanagawa-ken (JP)

( * ) Notice: Subject to any disclaimer, the term of this patent is extended or adjusted under 35 U.S.C. 154(b) by 0 days.

(21) Appl. No.: 16/523,050

(22) Filed: Jul. 26, 2019

(65) Prior Publication Data

US 2020/0224848 A1 Jul. 16, 2020

(30) Foreign Application Priority Data

Jan. 16, 2019 (JP) .................. 2019-005176

(51) Int. Cl.
*F21S 43/19* (2018.01)
*H05K 1/11* (2006.01)
(Continued)

(52) U.S. Cl.
CPC ............. *F21S 43/195* (2018.01); *F21S 45/48* (2018.01); *H05K 1/0203* (2013.01); *H05K 1/119* (2013.01); *H05K 1/144* (2013.01); *H05K 1/181* (2013.01); *H05K 2201/041* (2013.01); *H05K 2201/066* (2013.01); *H05K 2201/10121* (2013.01); *H05K 2201/10303* (2013.01); *H05K 2201/10424* (2013.01)

(58) Field of Classification Search
CPC ...... F21S 43/195; F21S 45/48; H05K 1/0203; H05K 1/119; H05K 1/114; H05K 1/181; H05K 2201/041; H05K 2201/066; H05K 2201/10121
See application file for complete search history.

(56) References Cited

U.S. PATENT DOCUMENTS 10,203,080 B1 * 2/2019 Ishiyama ............. B60Q 1/0416
2011/0175529 A1 7/2011 Hayashi et al.
(Continued)

FOREIGN PATENT DOCUMENTS

EP 2345836 A2 7/2011
EP 2355620 A1 8/2011
(Continued)

*Primary Examiner* — Anabel Ton
(74) *Attorney, Agent, or Firm* — Banner & Witcoff, Ltd.

(57) ABSTRACT

A vehicle luminaire according to an embodiment includes: a socket; a first board which is provided in the socket and has a first wiring pattern formed on one surface; at least one light-emitting element which is electrically connected to the first wiring pattern; and a plurality of power-supply terminals which are provided in the socket and are electrically connected to the first wiring pattern. The first board includes a plurality of first hollows which open to a side surface of the first board, a surface on an installation side of the light-emitting element in the first board, and a surface on the side opposite to the installation side of the light-emitting element in the first board. Each of the plurality of first hollows is provided with the power-supply terminal.

20 Claims, 10 Drawing Sheets

(51) Int. Cl.
  *H05K 1/14*    (2006.01)
  *F21S 45/48*   (2018.01)
  *H05K 1/02*    (2006.01)
  *H05K 1/18*    (2006.01)

(56) References Cited

U.S. PATENT DOCUMENTS

| | | |
|---|---|---|
| 2011/0181186 A1 | 7/2011 | Nakano et al. |
| 2015/0016136 A1* | 1/2015 | Nakano ................. F21S 43/195 362/520 |
| 2015/0325740 A1 | 11/2015 | Serita et al. |
| 2016/0185281 A1* | 6/2016 | Kaneko ................... F21S 45/48 362/547 |
| 2016/0290587 A1 | 10/2016 | Nakagawa et al. |
| 2017/0097136 A1* | 4/2017 | Hino ..................... F21V 29/767 |
| 2017/0146213 A1* | 5/2017 | Kosugi ................. F21S 43/195 |
| 2018/0051858 A1* | 2/2018 | Hatanaka ............... F21S 43/14 |
| 2018/0163941 A1 | 6/2018 | Lee et al. |
| 2019/0383463 A1* | 12/2019 | Kosugi ................... F21V 29/83 |
| 2019/0390830 A1* | 12/2019 | Hatanaka ............. F21V 19/004 |

FOREIGN PATENT DOCUMENTS

| | | |
|---|---|---|
| EP | 3327334 A1 | 5/2018 |
| JP | H07-114813 A | 5/1995 |
| JP | 2016-195099 A | 11/2016 |
| KR | 2016-0007757 A | 1/2016 |
| KR | 2016-0028081 A | 3/2016 |

* cited by examiner

VEHICLE LUMINAIRE AND VEHICLE LAMP DEVICE

CROSS-REFERENCE TO RELATED APPLICATIONS

This application is based upon and claims the benefit of priority from Japanese Patent Application No. 2019-005176, filed on Jan. 16, 2019; the entire contents of which are incorporated herein by reference.

FIELD

Embodiments described herein relate generally to a vehicle luminaire and a vehicle lamp device.

BACKGROUND

There is a vehicle luminaire which includes a socket and a light-emitting module provided on one end side of the socket.

In recent years, there has been a desire for a decrease in size of the vehicle luminaire. In order to decrease the size of the vehicle luminaire, a board provided in the light-emitting module needs to be decreased in size. However, since it is necessary to mount elements such as light-emitting elements, resistances, and diodes on the board, there has been a limitation for the decrease in size of the board and the decrease in size of the vehicle luminaire.

Therefore, there has been a desire for developing a technique capable of decreasing the size of the vehicle luminaire.

DETAILED DESCRIPTION

Figure 1:
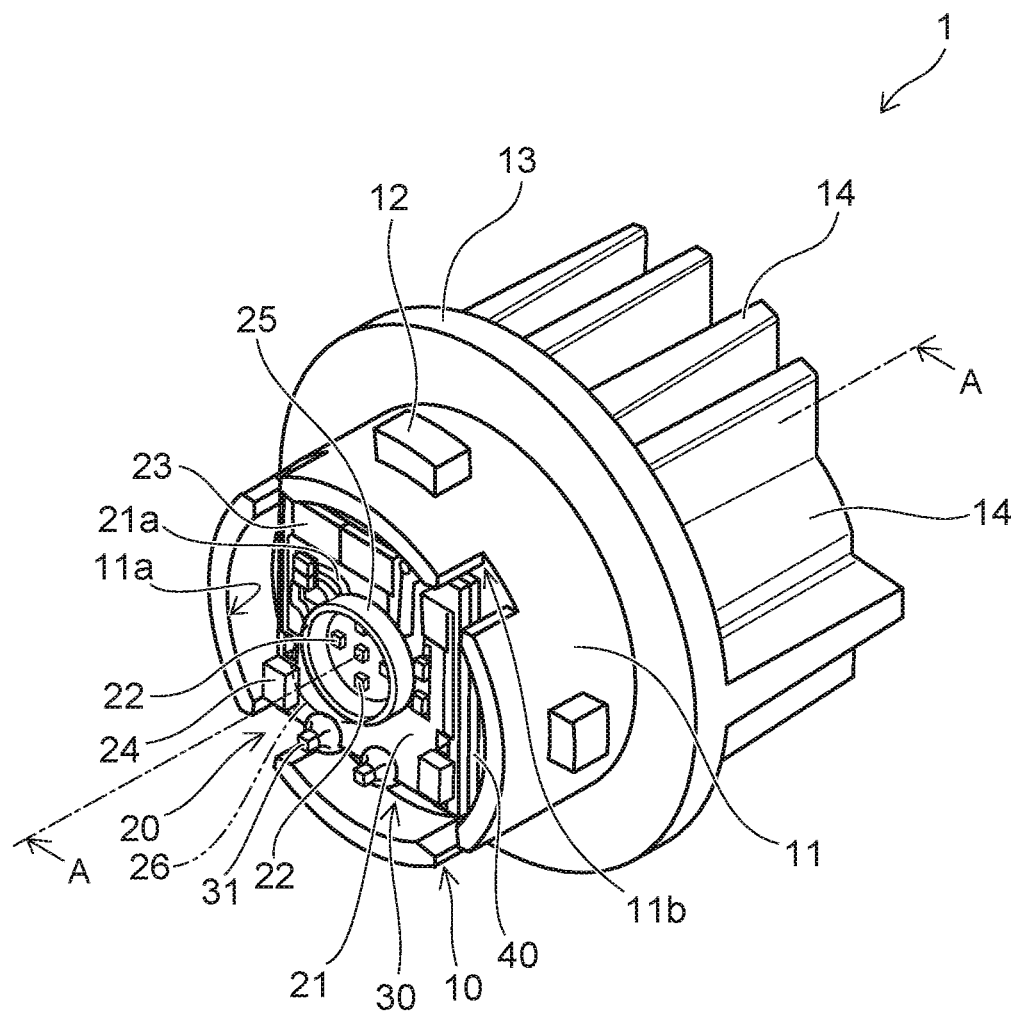
FIG. 1 is a perspective view for schematically exemplifying a vehicle luminaire according to an embodiment.

A vehicle luminaire according to an embodiment includes: a socket; a first board which is provided in the socket and has a first wiring pattern formed on one surface; at least one light-emitting element which is electrically connected to the first wiring pattern; and a plurality of power-supply terminals which are provided in the socket and are electrically connected to the first wiring pattern. The first board includes a plurality of first hollows which open to a side surface of the first board, a surface on an installation side of the light-emitting element in the first board, and a surface on the side opposite to the installation side of the light-emitting element in the first board. Each of the plurality of first hollows is provided with the power-supply terminal.

Hereinafter, embodiments are exemplified with reference to the drawings. Incidentally, in the drawings, the same reference signs are assigned to the same configurational elements, and the detailed description thereof is appropriately omitted.

(Vehicle Luminaire)

For example, a vehicle luminaire 1 according to the embodiment can be provided in an automobile or a rail vehicle. For example, as the vehicle luminaire 1 that is provided in an automobile, a luminaire that is used for a front combination light (for example, an appropriate combination of a daytime running lamp (DRL), a position lamp, a turn signal lamp, or the like) or a rear combination light (for example, an appropriate combination of a stop lamp, a tail lamp, a turn signal lamp, a back lamp, a fog lamp, or the like) can be exemplified. However, a use of the vehicle luminaire 1 is not limited thereto.

FIG. 1 is a perspective view for schematically exemplifying the vehicle luminaire 1 according to the embodiment.

Figure 2:
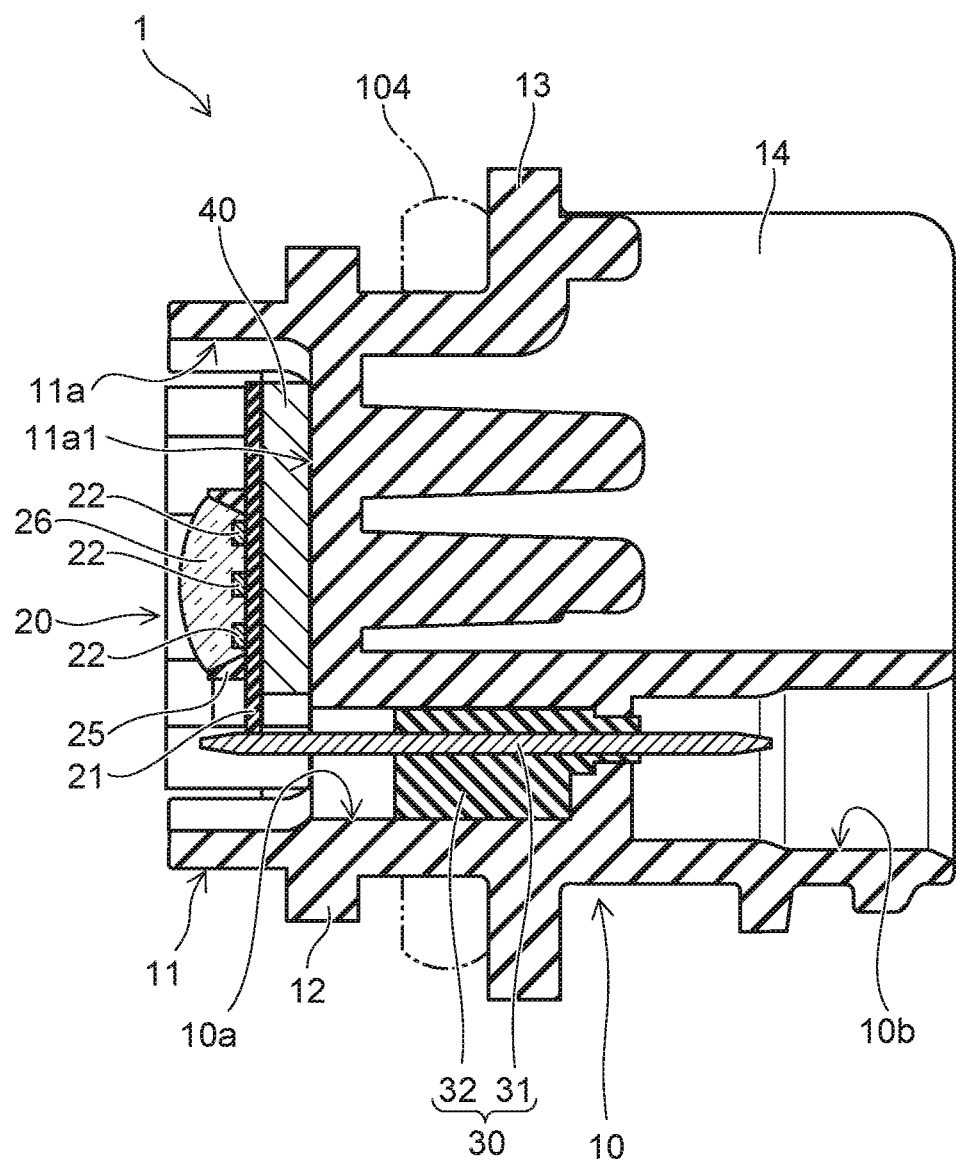
FIG. 2 is a sectional view taken along a line A-A of the vehicle luminaire of FIG. 1.

FIG. 2 is a sectional view taken along line A-A of the vehicle luminaire 1 of FIG. 1.

As illustrated in FIGS. 1 and 2, the vehicle luminaire 1 can be provided with a socket 10, a light-emitting module 20, a power-supply unit 30, and a heat-conducting unit 40.

The socket 10 can include a mount portion 11, a bayonet 12, a flange 13, and a thermal radiation fin 14.

The mount portion 11 can be provided on a surface opposite to an installation side of the thermal radiation fin 14 in the flange 13. The mount portion 11 can have a column-shaped external shape. For example, the mount portion 11 can have a circular column-shaped external shape. The mount portion 11 can include a hollow 11a which opens to an end face opposite to the flange 13. A bottom surface 11a1 of the hollow 11a can be provided with a light-emitting module 20.

The mount portion 11 can be provided with at least one slit 11b. A corner portion of a board 21 (corresponding to an example of the first board) can be provided inside the slit 11b. The dimension (the width dimension) of the slit 11b of the mount portion 11 in the circumferential direction can be set to be slightly larger than the dimension of the corner portion of the board 21. In this way, when the corner portion of the board 21 is inserted into the slit 11b, the board 21 can be positioned. Further, since the external dimension of the mount portion 11 can be set to be small when the slit 11b is provided, a decrease in size of the mount portion 11 and further a decrease in size of the vehicle luminaire 1 can be achieved.

The bayonet 12 can be provided on the outer surface of the mount portion 11. For example, the bayonet 12 protrudes toward the outside of the vehicle luminaire 1. The bayonet 12 can face the flange 13. A plurality of the bayonets 12 can be provided. The bayonet 12 can be used when attaching the vehicle luminaire 1 to a casing 101 of a vehicle lamp device 100. The bayonet 12 can be used for twist-lock.

The flange 13 can have a plate shape. For example, the flange 13 can have a disk shape. The outer surface of the flange 13 can be located at the outside of the vehicle luminaire 1 in relation to the outer surface of the bayonet 12.

The thermal radiation fin 14 can be provided on the side opposite to the mount portion 11 in the flange 13. At least one thermal radiation fin 14 can be provided. For example, a plurality of radiation fins are provided in the socket 10 illustrated in FIGS. 1 and 2. The plurality of thermal radiation fins 14 can be provided side by side in a predetermined direction. The thermal radiation fin 14 can have a plate shape.

Further, the socket 10 can be provided with a hole 10b into which a connector 105 is inserted. The connector 105 with a seal member 105a can be inserted into the hole 10b. Therefore, the cross-sectional shape of the hole 10b can be adapted to the cross-sectional shape of the connector 105 with the seal member 105a.

Heat generated in the light-emitting module 20 is mainly transmitted to the thermal radiation fin 14 through the mount portion 11 and the flange 13. Heat generated in the thermal radiation fin 14 is mainly discharged from the thermal radiation fin 14 to the outside. Therefore, the socket 10 is preferably formed of a high heat conductivity material. For example, the socket 10 can be formed of metal such as an aluminum alloy.

Further, in recent years, there has been a desire for efficiently radiating heat generated in the light-emitting module 20 from the socket 10 and decreasing the weight of the socket 10. Therefore, it is preferable that the mount portion 11, the bayonet 12, the flange 13, and the thermal radiation fin 14 are formed of a high heat conductivity resin. The high heat conductivity resin contains, for example, fillers formed of a resin and inorganic materials. The high heat conductivity resin can be, for example, one obtained by mixing fillers formed of carbon or aluminum oxide with a resin such as polyethylene terephthalate (PET) or nylon.

If the socket 10 is obtained by integrally molding the mount portion 11, the bayonet 12, the flange 13, and the thermal radiation fin 14 formed of the high heat conductivity resin, it is possible to efficiently radiate heat generated in the light-emitting module 20. Further, it is possible to reduce the weight of the socket 10. It is possible to integrally mold the mount portion 11, the bayonet 12, the flange 13, and the thermal radiation fin 14 by injection-molding.

The power-supply unit 30 can include a power-supply terminal 31 and an insulating portion 32.

The power-supply terminal 31 can be a rod-shaped body. The power-supply terminal 31 can protrude from the bottom surface 11a1 of the hollow 11a. A plurality of the power-supply terminals 31 can be provided. The plurality of power-supply terminals 31 can be provided side by side in a predetermined direction. The plurality of power-supply terminals 31 extend inside the insulating portion 32. Ends of the plurality of power-supply terminals 31 on the side of the light-emitting module 20 can be electrically connected to a wiring pattern 21a (corresponding to an example of the first wiring pattern) provided on the board 21.

Incidentally, a detailed description of the connection between the plurality of power-supply terminals 31 and the wiring pattern 21a will be made below.

Ends of the plurality of power-supply terminals 31 on the side of the thermal radiation fin 14 can be exposed into the hole 10b. The connector 105 can be fitted to the plurality of power-supply terminals 31 exposed into the hole 10b. The power-supply terminals 31 can be formed of, for example, metal such as a copper alloy. Incidentally, the number, disposition, a material, or the like of the power-supply terminals 31 is not limited to exemplified example and can be appropriately modified.

As described above, it is preferable that the socket 10 is formed of the high heat conductivity material. Incidentally, there is a case where the high heat conductivity material has conductivity. For example, metal such as an aluminum alloy or a high heat conductivity resin containing fillers formed of carbon has conductivity. Therefore, the insulating portion 32 can be provided to insulate the power-supply terminal 31 and the socket 10 having conductivity. Further, the insulating portion 32 can also have a function of holding the plurality of power-supply terminals 31. Incidentally, when the socket 10 is formed of a high heat conductivity resin (for example, a high heat conductivity resin or the like containing fillers formed of aluminum oxide) having an insulation property, the insulating portion 32 can be omitted. In this case, the socket 10 can hold the plurality of power-supply terminals 31.

The insulating portion 32 can be formed of a resin having an insulation property. For example, the insulating portion 32 can be press-inserted into the hole 10a provided in the socket 10 or adhered to the inner surface of the hole 10a. Further, the socket 10 and the power-supply unit 30 can be integrally molded by insert-molding.

The heat-conducting unit 40 can be provided between the board 21 and the bottom surface 11a1 of the hollow 11a. The heat-conducting unit 40 can be adhered to the bottom surface 11a1 of the hollow 11a. It is preferable that an adhesive adhering the heat-conducting unit 40 and the bottom surface 11a1 of the hollow 11a be an adhesive having high heat conductivity. For example, the adhesive can be an adhesive mixed with fillers using inorganic materials. For example, the heat conductivity of the adhesive can be 0.5 W/(m·K) or higher and 10 W/(m·K) or lower.

Further, the heat-conducting unit 40 can be buried in the bottom surface 11a1 of the hollow 11a by an insert molding method. Further, the heat-conducting unit 40 can be attached to the bottom surface 11a1 of the hollow 11a through a layer formed of a heat conductive grease (heat radiation grease). The heat conductive grease can be, for example, one obtained by mixing fillers using inorganic materials with modified silicone. For example, the heat conductivity of the heat conductive grease can be 1 W/(m·K) or higher and 5 W/(m·K) or lower.

The heat-conducting unit 40 is provided to cause the heat generated in the light-emitting module 20 to be easily transmitted to the socket 10. Therefore, it is preferable that the heat-conducting unit 40 is formed of a high heat conductivity material. The heat-conducting unit 40 has a plate shape and can be formed of, for example, metal such as aluminum, an aluminum alloy, copper, or a copper alloy.

Incidentally, the heat-conducting unit 40 is not essentially needed and hence can be omitted. Here, it is preferable to provide the heat-conducting unit 40 in consideration of the radiation of the heat generated in the light-emitting module 20.

The light-emitting module 20 can include the board 21, a light-emitting element 22, a resistance 23, a control element 24, a frame 25, and a sealing portion 26.

The board 21 is provided at one end side of the socket 10. The board 21 can be adhered to the heat-conducting unit 40. The adhesive can be, for example, the same as the adhesive which adheres the heat-conducting unit 40 to the bottom surface 11a1 of the hollow 11a.

The board 21 can have a plate shape. The planar shape of the board 21 can be, for example, a square. The board 21 can be formed of, for example, an inorganic material such as ceramics (for example, aluminum oxide or aluminum nitride), an organic material such as paper phenol or glass epoxy, or the like. In addition, the board 21 may be obtained by covering a surface of a metal plate with an insulation material. Incidentally, when the surface of the metal plate is covered with the insulation material, the insulation material may be made of an organic material or an inorganic material. When the heat generation amount of the light-emitting element 22 is large, it is preferable to form the board 21 by the high heat conductivity material from the viewpoint of thermal radiation. Examples of the material having high heat conductivity can include ceramics such as aluminum oxide or aluminum nitride, a high heat conductivity resin, a material obtained by covering a surface of a metal plate with an insulating material, or the like. Further, the board 21 may have a single layer structure or a multilayer structure.

Further, the surface of the board 21 can be provided with the wiring pattern 21*a*. The wiring pattern 21*a* can be formed of, for example, a material mainly containing silver or a material mainly containing copper.

The light-emitting element 22 can be provided on the side opposite to the bottom surface 11*a*1 of the hollow 11*a* in the board 21. The light-emitting element 22 can be electrically connected to the wiring pattern 21*a*. At least one light-emitting element 22 can be provided. In the case of the vehicle luminaire 1 illustrated in FIGS. 1 and 2, the plurality of light-emitting elements 22 are provided. Incidentally, when the plurality of light-emitting elements 22 are provided, the plurality of light-emitting elements 22 can be connected in series to each other. Further, the light-emitting element 22 can be connected in series to the resistance 23.

The light-emitting element 22 can be, for example, a light-emitting diode, an organic light-emitting diode, a laser diode, or the like.

The light-emitting element 22 can be a chip-like light-emitting element, a surface installation type light-emitting element, or a light emitting element having a bullet-shaped lead wire. Here, the chip-like light-emitting element is preferable in consideration of a decrease in size of the board 21 and further a decrease in size of the vehicle luminaire 1.

The chip-like light-emitting element 22 can be installed on the wiring pattern 21*a* by the chip-on-board (COB) method. When the light-emitting element 22 is an upper-lower electrode type light-emitting element or an upper electrode type light-emitting element, the light-emitting element 22 can be electrically connected to the wiring pattern 21*a* by, for example, a wire bonding method. When the light-emitting element 22 is a flip chip type light-emitting element, the light-emitting element 22 can be directly connected to the wiring pattern 21*a*.

The light emitting surface of the light-emitting element 22 faces the front surface side of the vehicle luminaire 1. The light-emitting element 22 mainly emits light toward the front surface side of the vehicle luminaire 1. The number, a size, disposition, or the like of the light-emitting elements 22 is not limited to exemplified example and can be appropriately modified depending on a size, use, or the like of the vehicle luminaire 1.

The resistance 23 can be provided on the side opposite to the bottom surface 11*a*1 of the hollow 11*a* in the board 21. The resistance 23 can be electrically connected to the wiring pattern 21*a*. The resistance 23 can be, for example, a surface installation type resistance unit, a resistance unit having a lead wire (a resistance unit having a metal oxide film), a filmy resistance unit formed by using a screen printing method, or the like. Incidentally, the resistance 23 illustrated in FIG. 1 is a filmy resistance unit.

The material of the filmy resistance unit can be, for example, ruthenium oxide ($RuO_2$). The filmy resistance unit can be formed by, for example, the screen printing method and a baking method. When the resistance 23 is the filmy resistance unit, it is possible to increase a contact area between the resistance 23 and the board 21, and thus it is possible to improve the thermal radiation property. In addition, it is possible to form a plurality of the resistances 23 at once. Therefore, productivity can be improved. Further, it is possible to suppress variation in resistance values of the plurality of resistances 23.

Here, since there is a variation in the forward voltage characteristics of the light-emitting element 22, a variation occurs in the brightness (light flux, luminance, light intensity, illuminance) of the light that radiates from the light-emitting element 22 if a voltage applied across an anode terminal and a ground terminal is set constant. Therefore, a value of a current that flows in the light-emitting element 22 can be set within a predetermined range by the resistance 23 so that the brightness of the light that radiates from the light-emitting element 22 is set within a predetermined range. In this case, a resistance value of the resistance 23 is changed, and thereby the value of the current that flows in the light-emitting element 22 can be set within a predetermined range.

When the resistance 23 is a surface installation type resistance unit or a resistance unit having a lead wire, it is possible to select the resistance 23 having an appropriate resistance value in response to the forward voltage characteristics of the light-emitting element 22. When the resistance 23 is the filmy resistance unit, the resistance value can be increased when a part of the resistance 23 is removed. For example, a part of the resistance 23 can be easily removed if the resistance 23 is irradiated with laser light. The number, a size, disposition, or the like of the resistances 23 is not limited to exemplified example and can be appropriately modified depending on the number, specifications, or the like of the light-emitting element 22.

The control element 24 can be provided on the side opposite to the bottom surface 11*a*1 of the hollow 11*a* in the board 21. The control element 24 can be electrically connected to the wiring pattern 21*a*. The control element 24 can be provided so that a reverse voltage is not applied to the light-emitting element 22 and a pulse noise from a reverse direction is not applied to the light-emitting element 22. The control element 24 can be, for example, a diode. The control element 24 can be, for example, a surface installation type diode or a diode having a lead wire. The control element 24 illustrated in FIG. 1 is a surface installation type diode.

In addition, a pull-down resistance can be provided in order to detect the disconnection of the light-emitting element 22 or to prevent false lighting or the like. Further, a covering portion which covers the wiring pattern 21*a* or the filmy resistance unit can be provided. The covering portion can contain, for example, a glass material.

The frame 25 can be provided on the side opposite to the bottom surface 11*a*1 of the hollow 11*a* in the board 21. The frame 25 can be adhered to the board 21. The frame 25 can have a frame shape. A region surrounded by the frame 25 can be provided with at least one light-emitting element 22. For example, the frame 25 can surround the plurality of light-emitting elements 22. The frame 25 can be formed of a resin. The resin can be, for example, a thermoplastic resin such as polybutylene terephthalate (PBT), polycarbonate (PC), PET, nylon, polypropylene (PP), polyethylene (PE), or polystyrene (PS).

Further, it is possible to improve reflectance to the light emitted from the light-emitting element 22 by mixing particles of titanium oxide or the like with a resin. Incidentally, the exemplary embodiment is not limited to particles of titanium oxide and particles formed of a material having high reflectance to the light emitted from the light-emitting element 22 may be mixed. Further, the frame 25 can be formed of, for example, white resin. That is, the frame 25 can have a function of defining the forming range of the sealing portion 26 and a function of a reflector.

Incidentally, a case where the frame 25 is molded by an injection molding method or the like and the molded frame 25 adheres to the board 21 has been exemplified, but the exemplary embodiment is not limited thereto. For example, the frame 25 can also be formed by applying a dissolved resin in a frame shape on the board 21 using a dispenser or the like and curing the resin.

Further, the frame 25 can be omitted. When the frame 25 is omitted, a dome-shaped sealing portion 26 covering the light-emitting element 22 can be provided. Incidentally, the forming range of the sealing portion 26 can be defined if the frame 25 is provided. Therefore, since it is possible to suppress an increase in plan dimension of the sealing portion 26, it is possible to realize a decrease in size of the board 21 and further a decrease in size of the vehicle luminaire 1.

The sealing portion 26 can be provided in a region surrounded by the frame 25. The sealing portion 26 can be provided to cover the region surrounded by the frame 25. The sealing portion 26 can be provided to cover the light-emitting element 22. The sealing portion 26 can be formed of a material having translucency. For example, the sealing portion 26 can be formed by filling a resin into the region surrounded by the frame 25. The filling of the resin can be performed by, for example, a liquid dispensing device such as a dispenser. The filled resin can be, for example, a silicone resin or the like. Further, the sealing portion 26 can contain a phosphor. The phosphor can be, for example, an yttrium-aluminum-garnet-based phosphor (YAG-based phosphor). Here, the type of phosphor can be appropriately changed so that a predetermined emission color can be obtained according to the application or the like of the vehicle luminaire 1.

Incidentally, when the light-emitting element 22 is a surface installation type light-emitting element or a light-emitting element having a bullet-shaped lead wire, the frame 25 and the sealing portion 26 can be omitted. Here, it is preferable to provide the frame 25 and the sealing portion 26 by setting the light-emitting element 22 as the chip-like light-emitting element in consideration of a decrease in size of the board 21 as described above.

Here, there has been a desire to decrease the size of the vehicle luminaire 1 in recent years. In order to decrease the size of the vehicle luminaire 1, the board 21 provided in the light-emitting module 20 also needs to be decreased in size. However, the board 21 is provided with a light-emitting element 22, a resistance 23, a control element 24, a frame 25, and a sealing portion 26. In this case, it is difficult to decrease a space for providing these components.

Figure 3:
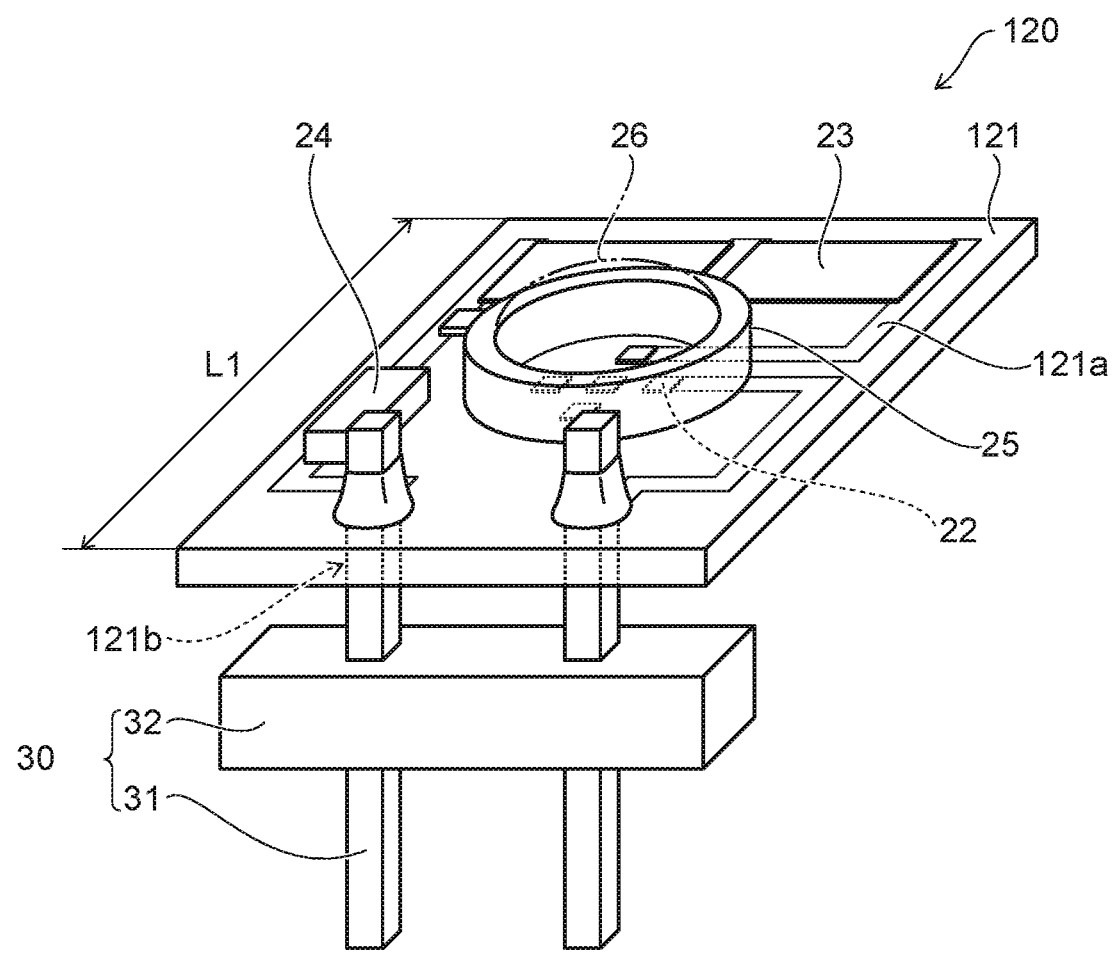
FIG. 3 is a perspective view for schematically exemplifying a light-emitting module according to a comparative example.

FIG. 3 is a perspective view for schematically exemplifying a light-emitting module 120 according to a comparative example.

As illustrated in FIG. 3, the light-emitting module 120 is provided with a board 121, the light-emitting element 22, the resistance 23, the control element 24, the frame 25, and the sealing portion 26.

The board 121 has a plate shape. The planar shape of the board 121 is a square. The surface of the board 121 is provided with a wiring pattern 121a. The light-emitting element 22, the resistance 23, and the control element 24 are electrically connected to the wiring pattern 121a.

Further, two holes 121b penetrating the board 121 in the thickness direction are provided in the vicinity of one side of the board 121. One end of the power-supply terminal 31 held by the insulating portion 32 is inserted into a hole 121b. The end of the power-supply terminal 31 inserted into the hole 121b is soldered to the wiring pattern 121a.

Further, the board 121 is provided with the frame 25 and the sealing portion 26. Therefore, the board 121 needs a space for providing the light-emitting element 22, the resistance 23, the control element 24, the frame 25, the sealing portion 26, and the power-supply terminal 31. In this case, it is possible to decrease the size of the board 121 when these components are omitted or decreased in size. However, it is difficult to omit or decrease the size of these components when the function or protection of the vehicle luminaire 1 is considered. Therefore, it is difficult to decrease the size of the board 121. For example, it is difficult to decrease a distance L1 between the installation side surface of the power-supply terminal 31 and its opposite side surface.

Figure 4:
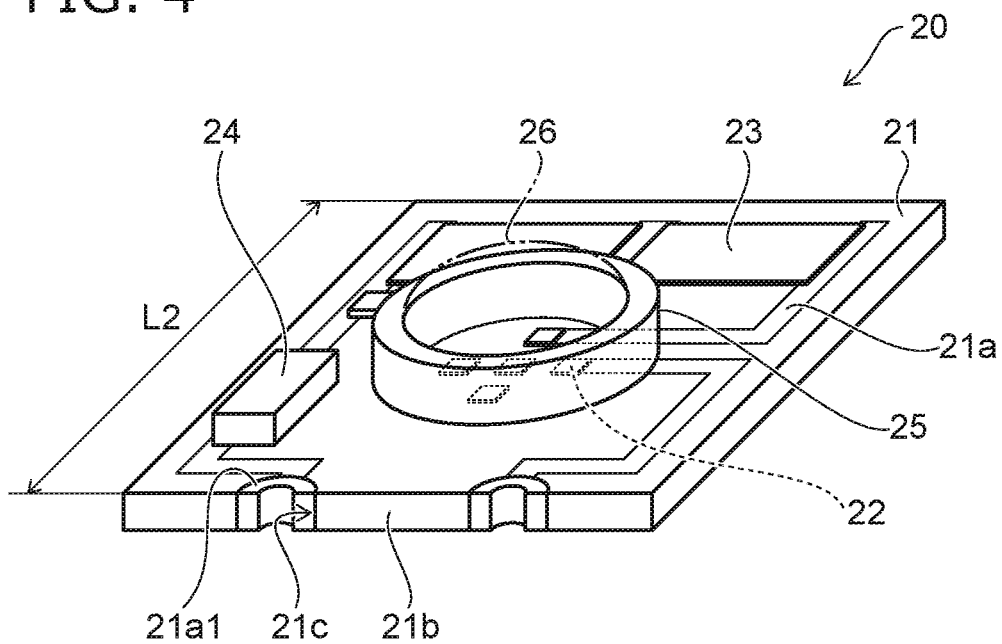
FIG. 4 is a perspective view for schematically exemplifying a light-emitting module according to the embodiment.
Figure 5:
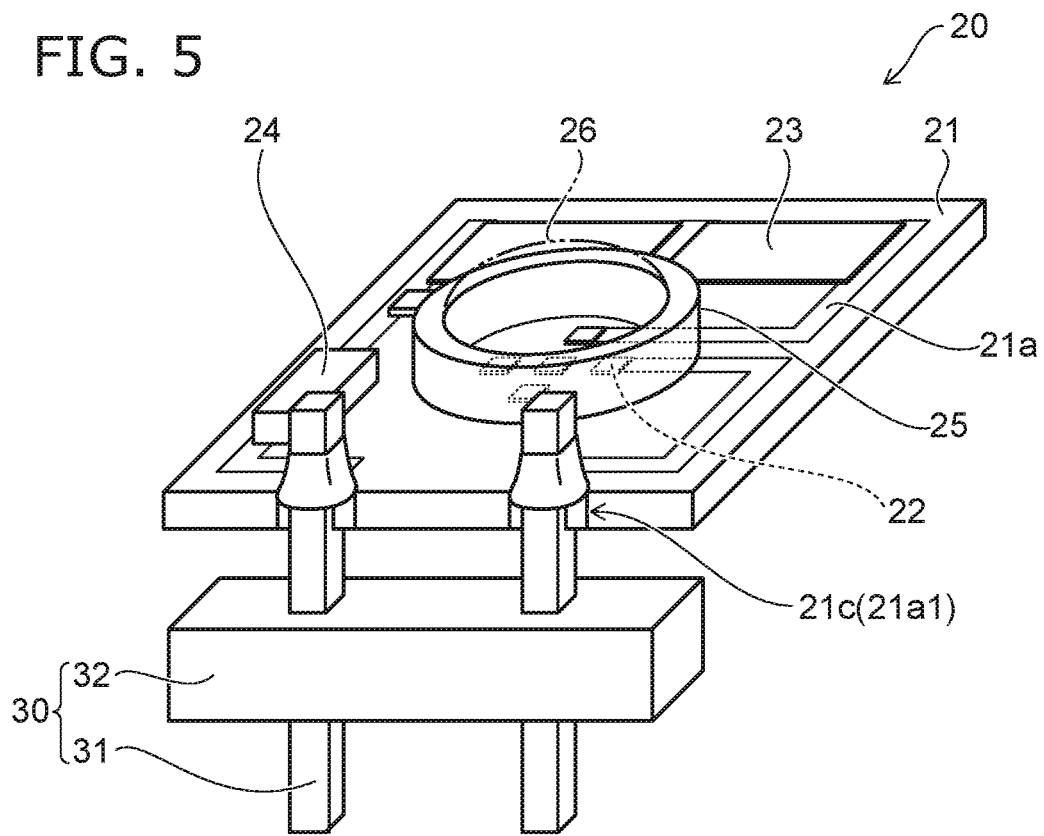
FIG. 5 is a perspective view for schematically exemplifying a connection between a plurality of power-supply terminals and a wiring pattern.

FIG. 4 is a perspective view for schematically exemplifying the light-emitting module 20 according to the embodiment. FIG. 5 is a perspective view for schematically exemplifying a connection between the plurality of power-supply terminals 31 and the wiring pattern 21a.

As illustrated in FIG. 4, one side surface 21b of the board 21 can be provided with a plurality of hollows 21c (corresponding to an example of the first hollow). The plurality of hollows 21c are open to the side surface 21b, the surface on the installation side of the light-emitting element 22 in the board 21, and the surface opposite to the installation side of the light-emitting element 22 in the board 21. The number of the hollows 21c can be set to, for example, the same number as that of the power-supply terminals 31. For example, as exemplified in FIGS. 4 and 5, two hollows 21c and two power-supply terminals 31 can be provided. Incidentally, the number of the hollows 21c and the number of the power-supply terminals 31 are not limited to those exemplified above.

The plurality of hollows 21c are provided at positions corresponding to the plurality of power-supply terminals 31. Each of the plurality of hollows 21c can be provided with the power-supply terminal 31. In this case, a part of the power-supply terminal 31 can be located at the outside of the side surface 21b. For example, the power-supply terminal 31 can protrude from the side surface 21b. Further, the side surface of the power-supply terminal 31 can be flush with the side surface 21b of the board 21. In this way, a space necessary to form the plurality of hollows 21c can be set to be smaller than a space necessary to form the plurality of holes 121b. Therefore, a distance L2 between the side surface 21b on the installation side of the power-supply terminal 31 and an opposite side surface thereof can be set to be smaller than the distance L1. As a result, it is possible to realize a decrease in size of the board 21 and further a decrease in size of the vehicle luminaire 1.

Further, since the power-supply terminal 31 is provided inside the hollow 21c, the power-supply terminal 31 can be positioned with respect to the board 21. Therefore, the power-supply terminal 31 can be easily soldered to the wiring pattern 21a. Here, since the hollow 21c does not surround the power-supply terminal 31 as in the hole 121b, the bonding strength between the board 21 and the power-supply terminal 31 is lower than the bonding strength between the board 121 and the power-supply terminal 31 according to the comparative example. However, the power-supply terminal 31 is fixed to the socket 10 and the board 21 is fixed to the heat-conducting unit 40 or the bottom surface 11a1 of the hollow 11a of the socket 10. Therefore, it is possible to suppress the power-supply terminal 31 from being separated from the board 21 even when the bonding strength between the board 21 and the power-supply terminal 31 decreases to a certain degree.

Further, as illustrated in FIG. 4, the inner wall of the hollow 21c can be provided with a conductive portion 21a1 (corresponding to an example of the first conductive portion) electrically connected to the wiring pattern 21a. For example, the conductive portion 21a1 electrically connected to the wiring pattern 21a can be formed by causing a paste-like material to flow into the hollow 21c when forming the wiring pattern 21a by screen printing or the like.

In this way, as illustrated in FIG. 5, since the conductive portion 21a1 can be soldered to the power-supply terminal 31, it is possible to improve the bonding strength between the board 21 and the power-supply terminal 31 and to improve the reliability of the electric connection between the wiring pattern 21a and the power-supply terminal 31.

Further, if the hole 121b penetrating the board 121 in the thickness direction is provided as in the board 121 according to the comparative example, stress concentration occurs when soldering iron hits the vicinity of the hole 121b of the board 121 and hence a crack occurs from the hole 121b. In contrast, since it is possible to reduce stress in the hollow 21c opening to the side surface 21b, it is possible to suppress the occurrence of the crack.

Figure 6:
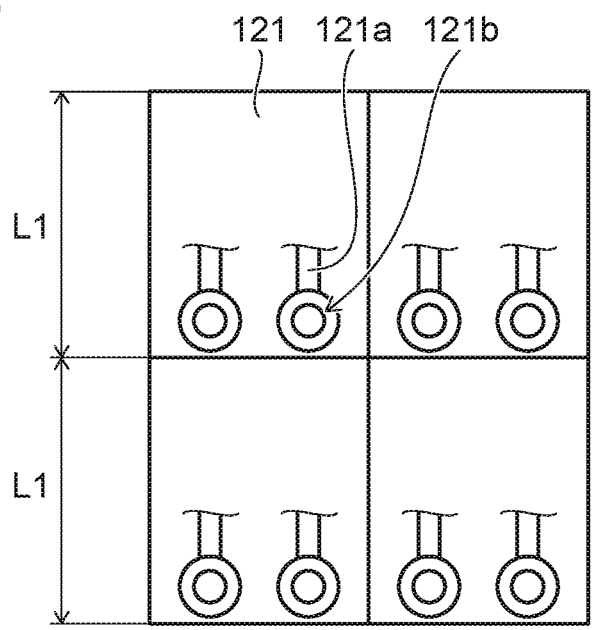
FIG. 6 is a plan view for schematically exemplifying a manufacturing of a board according to the comparative example.

FIG. 6 is a plan view for schematically exemplifying the manufacturing of the board 121 according to the comparative example.

As illustrated in FIG. 6, when manufacturing the board 121, the plurality of boards 121 are integrated and are cut or divided to separate the board 121.

Figure 7:
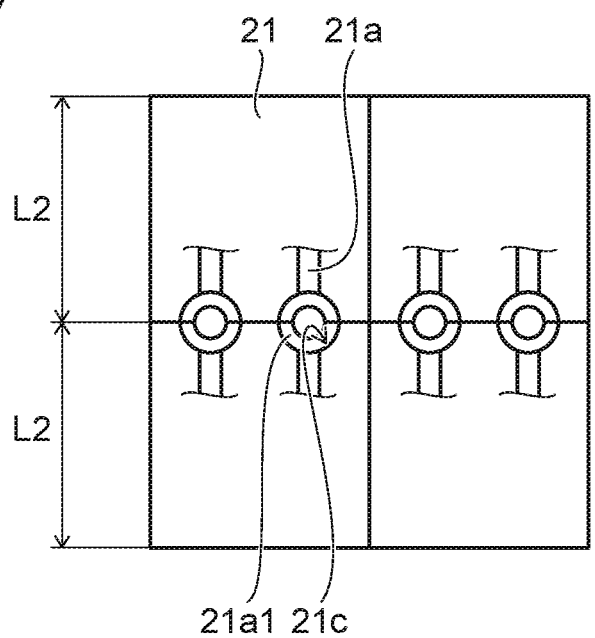
FIG. 7 is a plan view for schematically exemplifying a manufacturing of a board according to the embodiment.

FIG. 7 is a plan view for schematically exemplifying the manufacturing of the board 21 according to the embodiment.

As illustrated in FIG. 7, when manufacturing the board 21, the plurality of boards 21 are integrated and cut or divided to separate the board 21. In this case, if the hole 21c1 is provided on a cut line or a divided line, it is possible to form the hollow 21c by the cutting or dividing thereon.

Here, when the board 121 and the board 21 contain ceramics, the hole 121b and the hole 21c1 can be formed by laser processing. In this case, a manufacturing cost increases when the time necessary for the laser processing increases.

As understood from FIGS. 6 and 7, the number of the holes 21c1 can be a half of the number of the holes 121b. Therefore, it is possible to halve the time necessary for the laser processing.

Further, as described above, the distance L2 can be shorter than the distance L1. Therefore, a manufacturing cost can be reduced.

That is, a manufacturing cost can be reduced in the board 21 according to the embodiment.

Figure 8A:
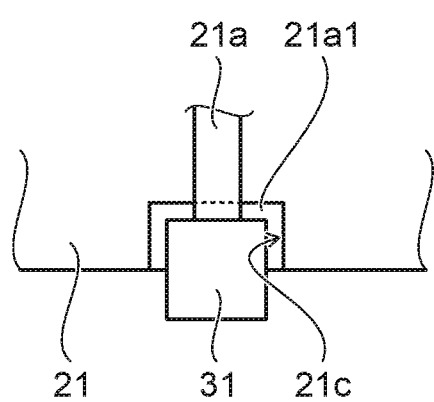
FIGS. 8A and 8B are plan views for schematically exemplifying a modified example of a hollow.
Figure 8B:
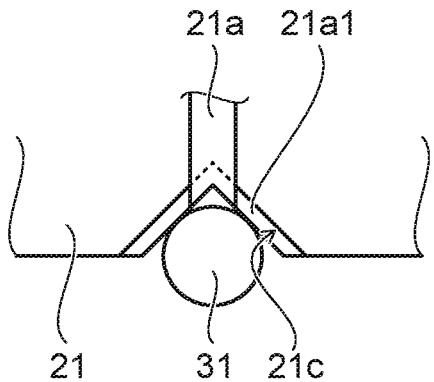

FIGS. 8A and 8B are plan views for schematically exemplifying a modified example of the hollow 21c.

In the case of the hollow 21c exemplified in FIGS. 4 and 7, an outline of the hollow 21c in plan view is a part of a circle (for example, a semi-circle), but the embodiment is not limited thereto. An outline of the hollow 21c in plan view may be set such that the position of the power-supply terminal 31 can be held to some extent.

For example, an outline of the hollow 21c in plan view can be a part of a polygon.

For example, as illustrated in FIG. 8A, an outline of the hollow 21c in plan view can be a part of a square.

For example, as illustrated in FIG. 8B, an outline of the hollow 21c in plan view can be a part of a triangle.

In this case, the conductive portion 21a1 can be provided in the inner wall of the hollow 21c regardless of the shape of the outline of the hollow 21c in plan view.

Further, for example, a cross-sectional shape of the power-supply terminal 31 can be a square as illustrated in FIG. 8A or a circle as illustrated in FIG. 8B.

Further, a gap may be formed between the conductive portion 21a1 and the power-supply terminal 31 and the conductive portion 21a1 may contact the power-supply terminal 31.

Figure 9:
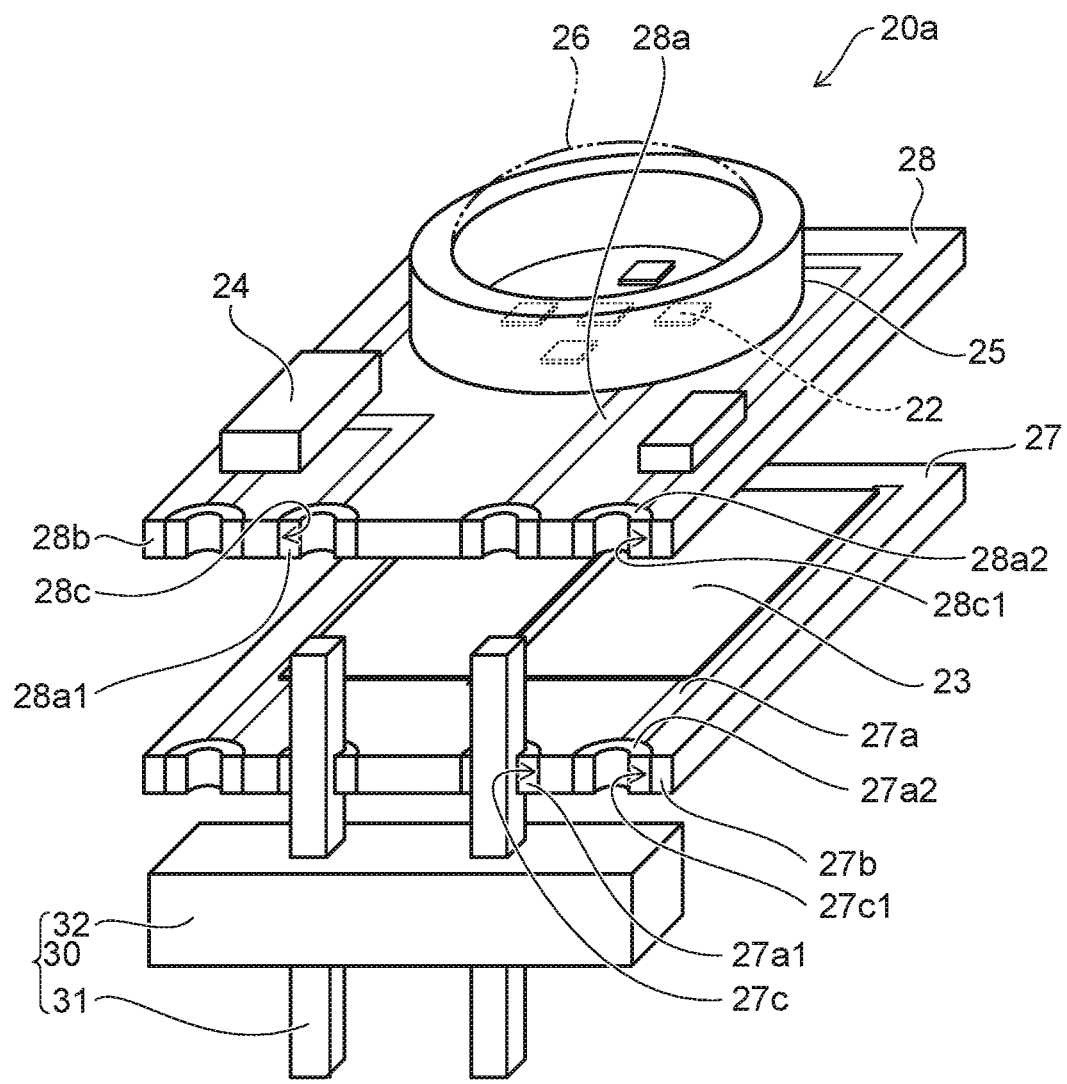
FIG. 9 is an exploded view for schematically exemplifying a light-emitting module according to another embodiment.

FIG. 9 is an exploded view for schematically exemplifying a light-emitting module 20a according to another embodiment.

Figure 10:
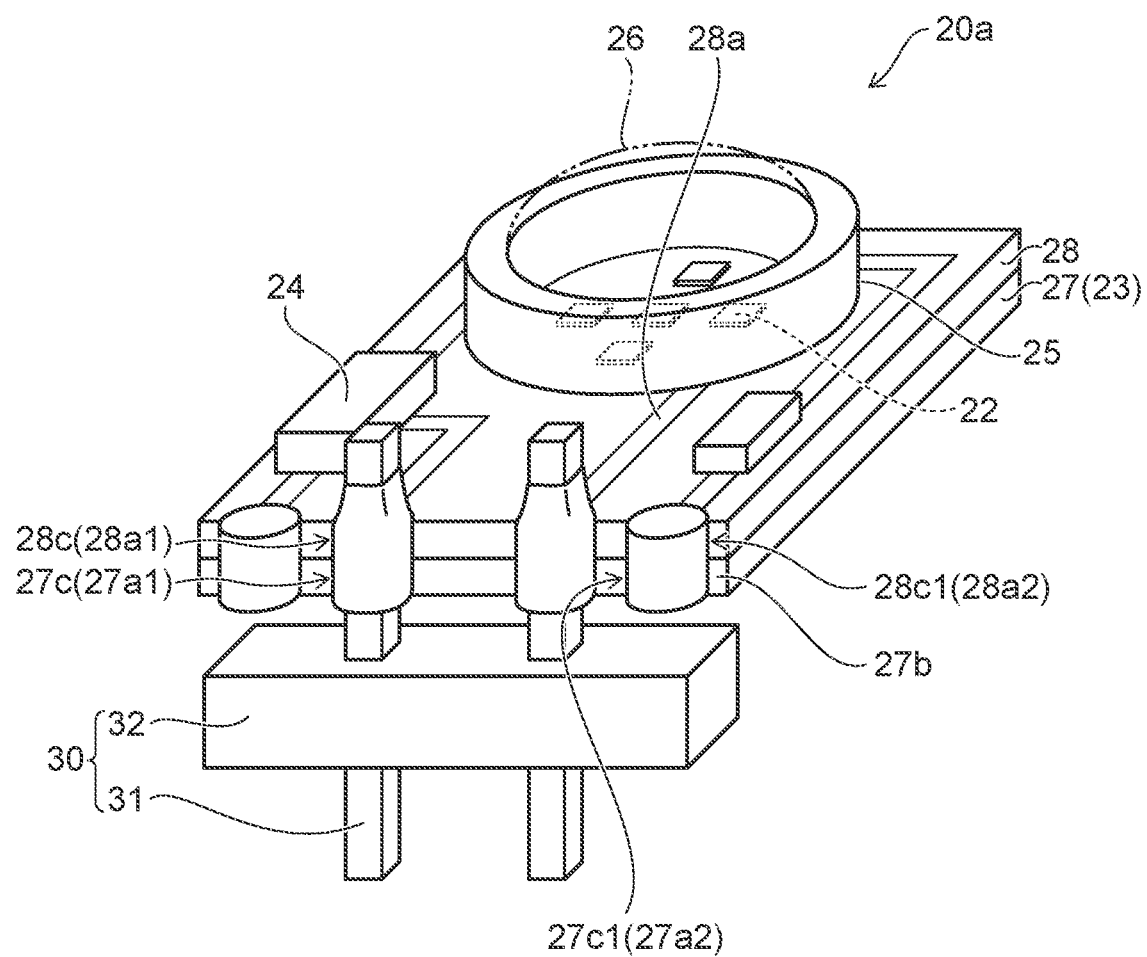
FIG. 10 is a perspective view for schematically exemplifying the light-emitting module.

FIG. 10 is a perspective view for schematically exemplifying the light-emitting module 20a.

As illustrated in FIG. 9, the light-emitting module 20a can include a board 27 (corresponding to an example of the second board) and a board 28 (corresponding to an example of the first board). The board 27 is provided between the board 28 and the socket 10.

A surface on the side of the board 28 in the board 27 can be provided with a wiring pattern 27a (corresponding to an example of the second wiring pattern) and a filmy resistance 23 electrically connected to the wiring pattern 27a.

A surface on the side opposite to the board 27 in the board 28 can be provided with a wiring pattern 28a (corresponding to an example of the first wiring pattern) and a component thicker than the resistance 23. For example, the board 28 can be provided with the light-emitting element 22, the control element 24, the frame 25, and the sealing portion 26.

In this way, since the necessary components can be distributed, the size of the board 27 and the board 28 can be set to be smaller than the size of the board 21. Incidentally, the sizes and planar shapes of the board 27 and the board 28 may be the same or different.

In the light-emitting module 20a having a lamination structure and distributed necessary components, the vehicle luminaire 1 can be further decreased in size.

Further, as illustrated in FIG. 9, one side surface 27b of the board 27 can be provided with a plurality of hollows 27c (corresponding to an example of the second hollow). The plurality of hollows 27c opens to the side surface 27b, a surface on the side of the board 28 in the board 27, and a surface on the side opposite to the board 28 in the board 27. Further, the inner wall of the hollow 27c can be provided with a conductive portion 27a1 (corresponding to an example of the second conductive portion) electrically connected to the wiring pattern 27a. For example, the conductive portion 27a1 electrically connected to the wiring pattern 27a can be formed by causing a paste-like material to flow into the hollow 27c when the wiring pattern 27a is formed by screen-printing or the like.

Further, one side surface 28b of the board 28 can be provided with a plurality of hollows 28c (corresponding to an example of the first hollow). The plurality of hollows 28c opens to the side surface 28b, a surface on the installation side of the light-emitting element 22 in the board 28, and a surface on the side opposite to the installation side of the light-emitting element 22 in the board 28. The number of the hollows 28c can be the same as the number of the hollows 27c. Each of the plurality of hollows 27c can be connected to the hollows 28c. For example, the hollow 28c can overlap the hollow 27c in plan view. The power-supply terminal 31 can be provided in the hollow 28c and the hollow 27c connected to the hollow 28c. Further, the inner wall of the hollow 28c can be provided with a conductive portion 28a1 (corresponding to an example of the first conductive portion) electrically connected to the wiring pattern 28a. For example, the conductive portion 28a1 electrically connected to the wiring pattern 28a can be formed by causing a paste-like material to flow into the hollow 28c when the wiring pattern 28a is formed by screen printing or the like.

Both of the hollow 27c and the hollow 28c exhibit the same operation and effect as those of the hollow 21c. For example, the power-supply terminal 31 can be positioned with respect to the boards 27 and 28. Therefore, the power-supply terminal 31 can be easily soldered to the wiring pattern 28a.

Further, since the conductive portions 27a1 and 28a1 can be soldered to the power-supply terminal 31 if the conductive portions 27a1 and 28a1 are provided, it is possible to improve the bonding strength between the boards 27 and 28 and the power-supply terminal 31 and to improve the reliability in the electric connection between the wiring patterns 27a and 28a and the power-supply terminal 31. Further, if the hollow 27c is provided similarly to the hollow 21c, it is possible to suppress an occurrence of a crack in the board 27. If the hollow 28c is provided, it is possible to suppress an occurrence of a crack in the board 28.

Further, the board 27 can be provided with at least one hollow 27c1 (corresponding to an example of the fourth hollow). The hollow 27c1 opens to the side surface 27b of the board 27, a surface on the side of the board 28 in the board 27, and a surface on the side opposite to the board 28 in the board 27.

The board 28 can be provided with at least one hollow 28c1 (corresponding to an example of the third hollow). The hollow 28c1 opens to the side surface 28b of the board 28, a surface on the installation side of the light-emitting element 22 in the board 28, and a surface on the side opposite to the installation side of the light-emitting element 22 in the board 28.

Further, a conductive portion 27a2 (corresponding to an example of the fourth conductive portion) provided in the inner wall of the hollow 27c1 and electrically connected to the wiring pattern 27a can be provided.

A conductive portion 28a2 (corresponding to an example of the third conductive portion) provided in the inner wall of the hollow 28c1 and electrically connected to the wiring pattern 28a can be provided.

The conductive portion 27a2 can be electrically connected to the conductive portion 28a2. For example, the conductive portion 27a2 and the conductive portion 28a2 can be soldered. The wiring pattern 27a and the wiring pattern 28a can be electrically connected by a conducting via or the like provided in the center region of the board 28. However, the connection state cannot be visually checked and a conduction test or the like needs to be performed. In contrast, when the conductive portion 27a2 and the conductive portion 28a2 are soldered, the soldered state can be visually checked. Therefore, a connection state can be easily checked.

Incidentally, a case where the hollow 27c1 is provided in the side surface 27b and the hollow 28c1 is provided in the side surface 28b has been exemplified. However, the hollow 27c1 and the hollow 28c1 may be provided on the side surfaces on the same side of the boards. For example, the side surfaces 27b and 28b provided with the hollows 27c and 28c may be different from the side surfaces provided with the hollows 27c1 and 28c1. The shapes or sizes of the hollows 27c1 and 28c1 may be the same as or different from the shapes or sizes of the hollows 27c and 28c. Further, at least a pair of the hollows 27c1 and 28c1 may be provided.

Figure 11A:
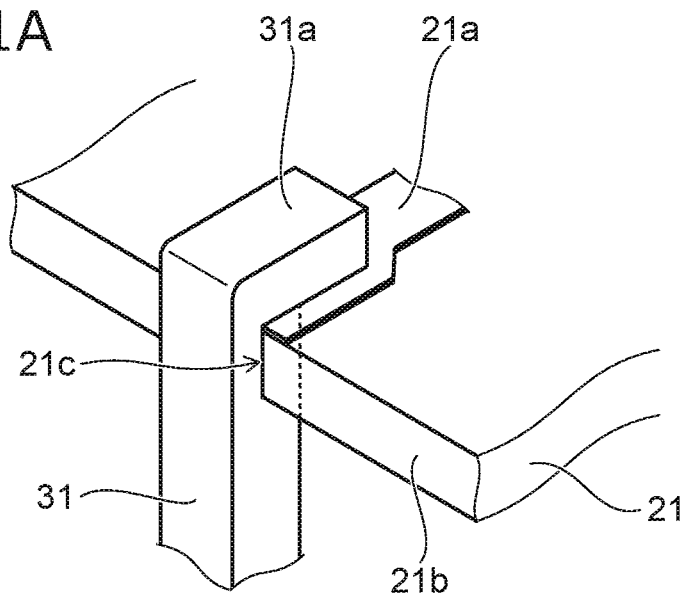
FIGS. 11A and 11B are schematic views for exemplifying a modified example of a front end shape of a power-supply terminal.
Figure 11B:
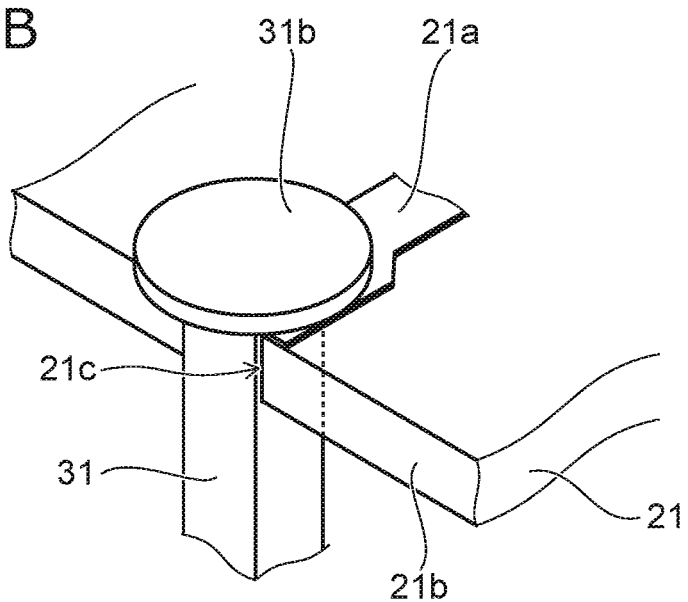

FIGS. 11A and 11B are schematic views for exemplifying a modified example of a front end shape of the power-supply terminal 31.

For example, as illustrated in FIG. 11A, the front end of the power-supply terminal 31 can be provided with a bent portion 31a. For example, the bent portion 31a can be formed by bending the front end of the power-supply terminal 31 in a direction intersecting the extension direction of the power-supply terminal 31.

For example, as illustrated in FIG. 11B, the front end of the power-supply terminal 31 can be provided with an enlarged portion 31b. For example, the enlarged portion 31b can be formed by pressing the front end of the power-supply terminal 31 or welding a plate-shaped body to the front end of the power-supply terminal 31. Incidentally, the enlarged portion 31b having a disk shape has been exemplified, but the shape of the enlarged portion 31b can be appropriately changed.

Since the hollow 21c is opened to the side surface 21b, the power-supply terminal 31 can be inserted into the hollow 21c even when the bent portion 31a or the enlarged portion 31b is provided.

The bent portion 31a or the enlarged portion 31b can be electrically connected to the wiring pattern 21a. For example, the bent portion 31a or the enlarged portion 31b can be soldered to the wiring pattern 21a. Since it is possible to secure a sufficient soldering region on the surface of the board 21 if the bent portion 31a or the enlarged portion 31b is provided, the conductive portion 21a1 can be also omitted. As described above, the conductive portion 21a1 can be formed by causing a paste-like material to flow into the hollow 21c. In this case, it is necessary to manage the amount of the material flowing into the hollow 21c. Therefore, since the bent portion 31a or the enlarged portion 31b is provided, it is possible to reduce a manufacturing cost if the conductive portion 21a1 can be omitted.

Further, if the enlarged portion 31b is provided, it is possible to improve the degree of freedom in the installation direction of the power-supply terminal 31 as compared with a case where the bent portion 31a is provided. Therefore, it is possible to suppress an occurrence of an erroneous assembly.

Further, if the bent portion 31a or the enlarged portion 31b is provided, it is possible to suppress the board 21 from being separated upward.

(Vehicle Lamp Device)

Next, the vehicle lamp device 100 will be exemplified.

Incidentally, a case where the vehicle lamp device 100 is a front combination light provided in an automobile will be described below as an example. Here, the vehicle lamp device 100 is not limited to the front combination light provided in the automobile. The vehicle lamp device 100 may be a vehicle lamp device provided in automobiles, rail vehicles, and the like.

Figure 12:
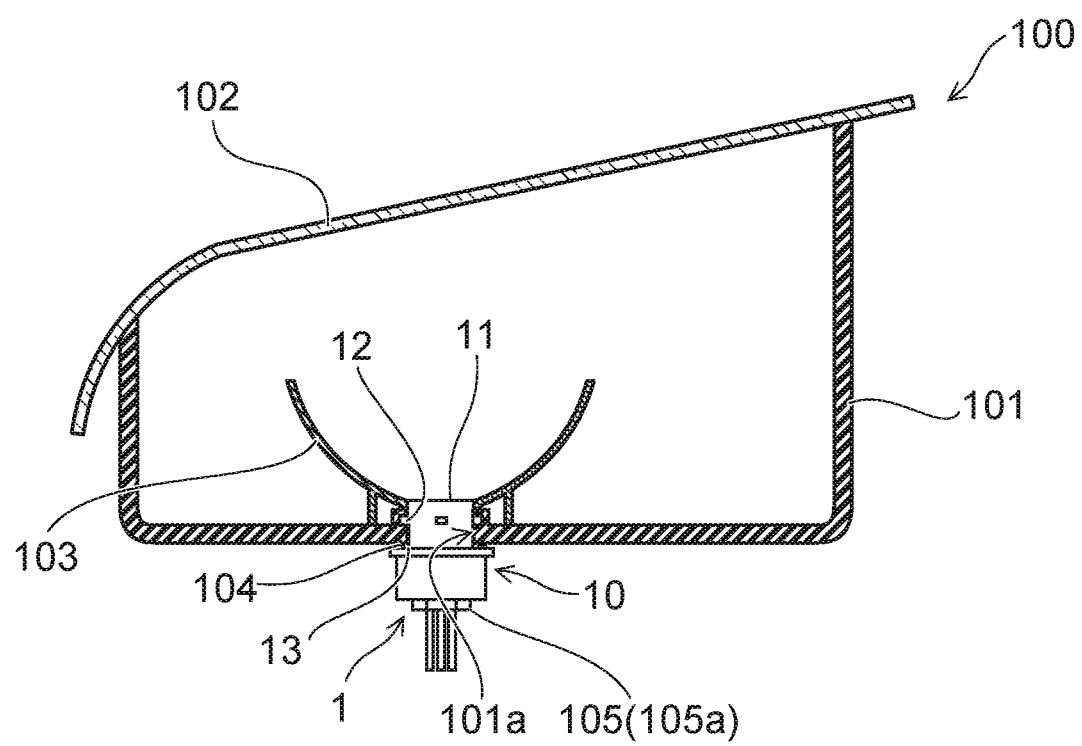
FIG. 12 is a partial sectional view for schematically exemplifying a vehicle lamp device.

FIG. 12 is a partial sectional view for schematically exemplifying the vehicle lamp device 100.

As illustrated in FIG. 12, the vehicle lamp device 100 can be provided with the vehicle luminaire 1, the casing 101, a cover 102, an optical element unit 103, a seal member 104, and the connector 105.

The vehicle luminaire 1 can be installed in the casing 101. The casing 101 can hold the mount portion 11. The casing 101 can have a case shape of which one end side is opened. The casing 101 can be formed of, for example, a resin or the like through which light does not pass. The bottom surface of the casing 101 can be provided with an installation hole 101a into which a portion provided with the bayonet 12 in the mount portion 11 is inserted. A peripheral edge of the installation hole 101a can be provided with a hollow into which the bayonet 12 provided in the mount portion 11 is inserted. Incidentally, a case where the installation hole 101a is directly provided in the casing 101 has been exemplified, but an installation member having the installation hole 101a may be provided in the casing 101.

When the vehicle luminaire 1 is installed in the vehicle lamp device 100, a portion provided with the bayonet 12 in the mount portion 11 is inserted into the installation hole 101a to rotate the vehicle luminaire 1. Then, for example, the bayonet 12 is held by a fitting portion provided in the peripheral edge of the installation hole 101a. Such an installation method is called twist-lock.

The cover 102 can be provided to block the opening of the casing 101. The cover 102 can be formed of a resin or the like having translucency. The cover 102 can have a function of a lens or the like.

Light emitted from the vehicle luminaire 1 is incident to the optical element unit 103. The optical element unit 103 can reflect, diffuse, guide, and collect the light emitted from the vehicle luminaire 1 and form a predetermined light distribution pattern. For example, the optical element unit 103 exemplified in FIG. 12 is a reflector. In this case, the optical element unit 103 can form a predetermined light distribution pattern by reflecting the light emitted from the vehicle luminaire 1.

The seal member 104 can be provided between the flange 13 and the casing 101. The seal member 104 can have an annular shape. The seal member 104 can be formed of an elastic material such as rubber or a silicone resin.

When the vehicle luminaire 1 is installed in the vehicle lamp device 100, the seal member 104 is sandwiched between the flange 13 and the casing 101. Therefore, an inner space of the casing 101 can be sealed by the seal member 104. Further, the bayonet 12 is pressed against the casing 101 by the elastic force of the seal member 104. Therefore, it is possible to suppress the vehicle luminaire 1 from being separated from the casing 101.

The connector 105 can be fitted to the ends of the plurality of power-supply terminals 31 exposed into the hole 10b. A power-supply (not illustrated) or the like can be electrically connected to the connector 105. Therefore, since the connector 105 can be fitted to the ends of the plurality of power-supply terminals 31, the power-supply (not illustrated) or the like can be electrically connected to the light-emitting element 22.

Further, the connector 105 can be provided with the seal member 105a. When the connector 105 with the seal member 105a is inserted into the hole 10b, the hole 10b is water-tightly sealed. The seal member 105a has an annular shape and can be formed of an elastic material such as rubber or a silicone resin.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A vehicle luminaire comprising:
a socket;
a first board which is provided in the socket and has a first wiring pattern formed on one surface;
at least one light-emitting element which is electrically connected to the first wiring pattern; and
a plurality of power-supply terminals which are provided in the socket and are electrically connected to the first wiring pattern,
the first board including a plurality of first hollows which open to a side surface of the first board, a surface on an installation side of the light-emitting element in the first board, and a surface on the side opposite to the installation side of the light-emitting element in the first board, and
each of the plurality of first hollows being provided with the power-supply terminal, a side surface of the power-supply terminal being exposed from the side surface of the first board.

2. The luminaire according to claim 1, further comprising:
a first conductive portion which is provided in an inner wall of each of the plurality of first hollows and is electrically connected to the first wiring pattern.

3. The luminaire according to claim 2, further comprising:
a second board which is provided between the first board and the socket,
wherein the second board includes a plurality of second hollows which open to a side surface of the second board, a surface on the side of the first board in the second board, and the surface on the side opposite to the first board in the second board,
each of the first hollows being connected to one of the plurality of second hollows, and
each of the first hollows and the corresponding second hollow connected to the respective first hollow are provided with one of the power-supply terminals.

4. The luminaire according to claim 3,
wherein a second wiring pattern is provided in the surface on the side of the first board in the second board, and
an inner wall of each of the plurality of second hollows is further provided with a second conductive portion electrically connected to the second wiring pattern.

5. The luminaire according to claim 4,
wherein the surface on the side of the first board in the second board is further provided with a filmy resistance electrically connected to the second wiring pattern.

6. The luminaire according to claim 4,
wherein the first board includes at least one third hollow which opens to the side surface of the first board, the surface on the installation side of the light-emitting element in the first board, and the surface on the side opposite to the installation side of the light-emitting element in the first board, and
the second board includes at least one fourth hollow which opens to the side surface of the second board, the surface on the side of the first board in the second board, and the surface on the side opposite to the first board in the second board,
the luminaire further comprising:
a third conductive portion which is provided in an inner wall of the third hollow and is electrically connected to the first wiring pattern; and a fourth conductive portion which is provided in an inner wall of the fourth hollow and is electrically connected to the second wiring pattern and the third conductive portion.

7. The luminaire according to claim 1,
wherein a front end of the power-supply terminal is provided with a bent portion or an enlarged portion, and
the bent portion or the enlarged portion is electrically connected to the first wiring pattern.

8. The luminaire according to claim 1,
wherein a part of the power-supply terminals is located at the outside of a side surface where the plurality of first hollows open in the first board.

9. The luminaire according to claim 1,
wherein the side surface of the power-supply terminal protrudes from a side surface where the plurality of first hollows open in the first board.

10. The luminaire according to claim 1,
wherein the side surface of the power-supply terminal is flush with a side surface where the plurality of first hollows open in the first board.

11. The luminaire according to claim 1,
wherein an outline of the plurality of first hollows in plan view is a part of a circle.

12. The luminaire according to claim 1,
wherein an outline of the plurality of first hollows in plan view is a part of a polygon.

13. The luminaire according to claim 1,
wherein an outline of the plurality of first hollows in plan view is a part of a square.

14. The luminaire according to claim 1,
wherein an outline of the plurality of first hollows in plan view is a part of a triangle.

15. The luminaire according to claim 1,
wherein a cross-sectional shape of the plurality of power-supply terminals in plan view is a square.

16. The luminaire according to claim 1,
wherein a cross-sectional shape of the plurality of power-supply terminals in plan view is a circle.

17. The luminaire according to claim 2,
wherein the power-supply terminal provided in each of the plurality of first hollows is soldered to the first conductive portion.

18. The luminaire according to claim 4,
wherein the power-supply terminals provided in the first hollows and the second hollows connected to the first hollows are soldered to the first conductive portion and the second conductive portion.

19. The luminaire according to claim 1,
wherein the socket contains a high heat conductivity resin.

20. A vehicle lamp device comprising:
the vehicle luminaire according to claim 1; and
a casing in which the vehicle luminaire is installed.

* * * * *